United States Patent
Partsch et al.

(10) Patent No.: US 6,661,265 B2
(45) Date of Patent: Dec. 9, 2003

(54) DELAY LOCKED LOOP FOR GENERATING COMPLEMENTARY CLOCK SIGNALS

(75) Inventors: Torsten Partsch, Chapel Hill, NC (US); Thilo Marx, Villingen-Schwenningen (DE); Patrick Heyne, München (DE); Thomas Hein, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/178,251

(22) Filed: Jun. 24, 2002

(65) Prior Publication Data

US 2003/0001636 A1 Jan. 2, 2003

(30) Foreign Application Priority Data

Jun. 22, 2001 (DE) .......................... 101 30 123

(51) Int. Cl.[7] ................................ H03L 7/06
(52) U.S. Cl. ................... 327/158; 327/161; 327/163; 327/276; 327/277; 327/299
(58) Field of Search ................ 327/141, 144, 327/145, 147, 149, 150, 156, 158, 159, 176, 296, 299

(56) References Cited

U.S. PATENT DOCUMENTS 5,008,563 A * 4/1991 Kenney et al. ............. 327/176
6,043,697 A * 3/2000 Jang .......................... 327/299
6,448,826 B1 * 9/2002 Ooishi et al. ............... 327/158
6,489,823 B2 * 12/2002 Iwamoto .................... 327/158
6,586,978 B2 * 7/2003 Stief .......................... 327/158

FOREIGN PATENT DOCUMENTS

| DE | 195 33 414 C1 | 1/1997 |
| DE | 197 01 937 A1 | 7/1997 |
| WO | WO 99/07070 | 2/1999 |

* cited by examiner

Primary Examiner—Vibol Tan
(74) Attorney, Agent, or Firm—Laurence A. Greenberg; Werner H. Stemer; Ralph E. Locher

(57) ABSTRACT

A delay locked loop has a delay unit with a delay time that can be controlled in a manner dependent on a control signal. In order to generate complementary delayed clock signals, provision is made of switching elements, which tap off the clock signal to be delayed along the series circuit of delay elements. Each of the delay elements has a series circuit of two inverters. One of the delayed clock signals is tapped off in each case at the output of the second of the inverters of the delay elements, and the complementary output signal from the delayed output signals is tapped off at the first of the inverters. What is thus made possible is that, disregarding the frequency of the clock signal to be delayed and the length of the delay time, the complementary delayed clock signals always have the same phase angle with respect to one another.

6 Claims, 2 Drawing Sheets

DELAY LOCKED LOOP FOR GENERATING COMPLEMENTARY CLOCK SIGNALS

BACKGROUND OF THE INVENTION

Field of the Invention

The invention relates to a delay locked loop having a delay unit with a controllable delay time and a feedback loop, for controlling the delay time, complementary delayed clock signals being able to be tapped off.

Delay locked loops are used in circuits that operate digitally in order to generate clock signals with a predetermined phase angle. By way of example, in synchronously operated integrated semiconductor memories, so-called synchronous dynamic random access memories (SDRAMs), a delay loop is used to generate a clock signal while taking account of internal signal propagation times, which clock signal provides data that are to be output synchronously with an input clock signal fed to the integrated circuit at a different location.

For this purpose, in the delay locked loop, a phase detector is used to compare the clock signal fed to the delay unit on the input side with the clock signal output by the delay unit on the output side, the feedback loop additionally contains a fixed delay time which represents the downstream signal propagation times. A loop filter, for example embodied in a manner based on a counter, controls the delay time of the delay unit. The control loop adjusts the delay time to such an extent that the phase difference at the phase detector is corrected as far as possible to zero. The delay unit contains a multiplicity of cascaded delay elements, to each of which a switch that can be driven by the counter is connected in order to switch the output signal of the respective delay element through to the output of the delay unit. The number of delay elements that are activated between the input and output of the delay unit determines the instantaneous delay time.

Such delay locked loops can be configured to generate complementary clock signals on the output side. The complementary clock signals are either processed further separately from one another or combined again to form a single-phase clock signal. In this case, it is important that two corresponding edges of the delayed clock signal and the delayed inverted clock signal are not phase-shifted with respect to one another.

SUMMARY OF THE INVENTION

It is accordingly an object of the invention to provide a delay locked loop for generating complementary clock signals that overcomes the above-mentioned disadvantages of the prior art devices of this general type, which generates two complementary delayed clock signals even at high frequencies in a manner free from errors and phase-synchronously with respect to one another.

With the foregoing and other objects in view there is provided, in accordance with the invention, a delay locked loop for generating complementary clock signals. The delay locked loop contains a delay unit having a terminal for receiving a clock signal to be delayed, a first output terminal for a delayed clock signal, a second output terminal for a delayed complementary clock signal, and a control terminal for receiving a control signal controlling a delay time. The delay unit includes a series circuit of delay elements. The delay elements each have a series circuit formed by a first inverter with an output and a second inverter with an output, the second inverter is connected downstream of the first inverter. First switching elements are provided and receive and can be switched by the control signal. Each of the first switching elements has an input connected to the output of the first inverter of one of the delay elements. The first switching elements have outputs connected to each other and form a first common node, and the first common node is coupled to one of the first and second output terminals. Second switching elements are provided and receive and can be switched by the control signal. Each of the second switching elements has an input connected to the output of the second inverter of one of the delay elements. The second switching elements have outputs connected to each other and form a second common node, and the second common node is coupled to another of the first and second output terminals. A feedback loop feeds one of the delayed clock signal and the delayed complementary clock signal provided from the first output terminal and the second output terminal, respectfully, back to the control terminal.

In the case of the delay locked loop according to the invention, the delay unit contains delay elements that, for their part, in turn have a first and a second inverter connected in series one after the other. Only a single series circuit is provided for delaying the clock signal. Pulses for the inverted delayed output clock signal are tapped off at the outputs of the respective first inverters via switching elements, and the delayed non-inverted clock pulses are tapped off at the outputs of the respective second inverters via corresponding switches. The delay time is controlled and set by a respective one of the switches being activated in order to tap off the clock signal in accordance with the desired delay time at a suitable location on the delay path. The delay time is thus determined by the number of delay elements acting on the clock signal to be delayed. The configuration has the advantage that the outputs of all the first and all the second inverters are always connected up to the same capacitive load, namely either a downstream-connected inverter of the delay unit or a switching element for tapping off the non-inverted or inverted delayed clock signal. This ensures that all the edges of the clock signal propagating through the delay unit are delayed by exactly the same delay time within each inverter of the delay elements of the delay unit. Therefore, the inverted and the non-inverted delayed clock signals are always tapped off synchronously with respect to one another, to be precise independently of whether the tapping-off is effected at the beginning of the delay unit after a short set delay time or at the end of the delay unit after a long set delay time. The synchronism of tapped-off delayed inverted and delayed non-inverted clock signals remains even at high frequencies of the clock signal. The circuit is therefore particularly suitable for subsequently combining non-inverted and inverted delayed clock signals again to form a single-phase clock signal.

By way of example, if the synchronism of the inverted and non-inverted delayed clock signals were not present and differed in the case of tapping-off at the beginning of the delay unit compared with tapping-off at the end of the delay unit, then it would have to be expected that pulses would be suppressed at high frequencies of the clock signal to be delayed, at the output. Such a disadvantage no longer exists in the case of the invention.

After it has been tapped off, the inverted delayed output signal is again subjected to a further delay that corresponds precisely to the delay time of one of the always identical inverters of the delay unit. As a result, the synchronously tapped-off edges of the inverted and non-inverted delayed clock signals are brought exactly into temporal correspondence and oriented to one another. The additional delay time is effected by a non-inverting further delay element.

An in each case an identically constructed driver, for example an inverter, is again expediently connected downstream of the common node to which the switches joining the delay unit and serving for tapping off the inverted clock signal are connected and the common node to which the switching elements for tapping off the non-inverted clock signal are connected. All the switches that serve for tapping off the inverted and non-inverted delayed clock signals are tri-state gates. Tristate gates can be switched into a transmissive state and into a high-impedance state by a control signal. In the transmissive switching state, they forward a signal fed in on the input side in an inverted form. In the high-impedance state, they are blocked. All the tri-state gates are controlled in the delay locked loop by a loop filter that is driven by the feedback loop of the delay locked loop.

In accordance with an added feature of the invention, the second inverter has a predetermined delay time, and a further delay element is connected between one of the first and second common nodes and one of the first and second output terminals. The further delay element has a delay time equal to the predetermined delay time.

In accordance with a further feature of the invention, the further delay element is connected to the second output terminal supplying the delayed complementary clock signal that is complementary with respect to the delayed clock signal.

In accordance with another feature of the invention, the further delay element has an output terminal for outputting an input signal fed to the further delay element in a noninverted form and delayed by the predetermined delay time.

Other features which are considered as characteristic for the invention are set forth in the appended claims.

Although the invention is illustrated and described herein as embodied in a delay locked loop for generating complementary clock signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
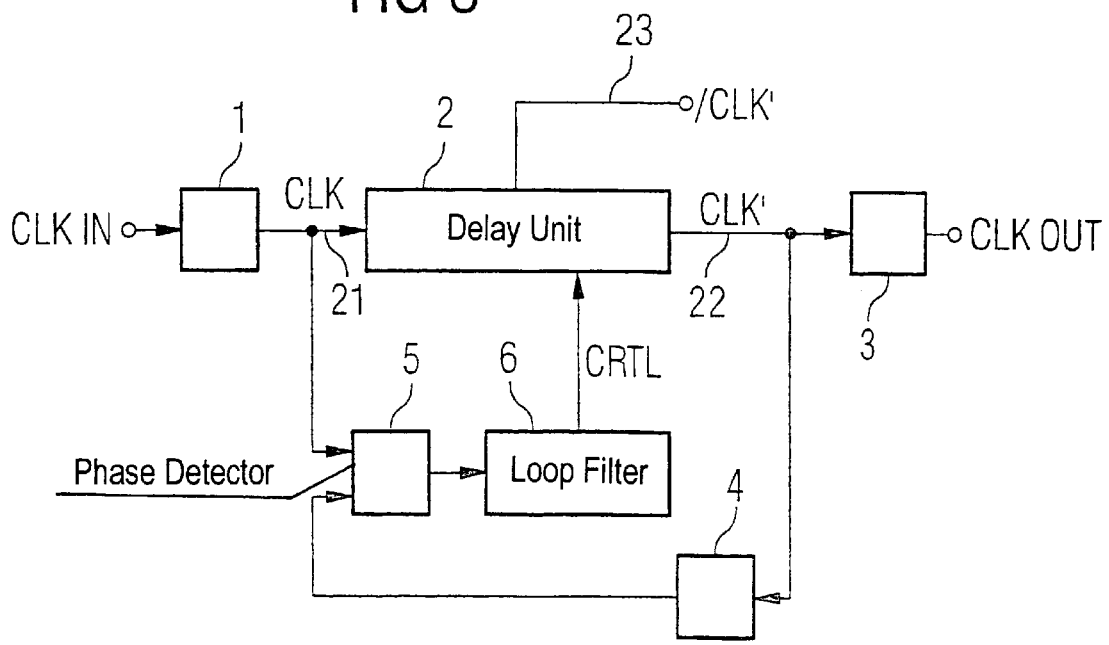
FIG. 3 is a block diagram of a delay locked loop in which the delay unit of FIG. 1 can be employed.

Referring now to the figures of the drawing in detail and first, particularly, to FIG. 3 thereof, there is shown a clock signal CLKIN that is fed to a delay locked loop on an input side, for example at an input terminal of the integrated semiconductor circuit. The circuit block 1 represents a signal propagation time that is present as far as an input side of a delay unit 2 with a controllable delay time. The delay unit 2 delays the clock signal CLK fed to it on the input side according to a control signal CTRL and generates a delayed clock signal CLK' therefrom. In addition, the delay unit generates an inverted delayed clock signal /CLK'. Finally, the circuit block 3 represents a signal propagation time that is effective on an output side, including the signal propagation time through the drivers driven by the clock signal CLKOUT. The clock signal CLKOUT is present at the output of block 3. The delay locked loop has a feedback loop that leads the output of the delay unit 2 via a circuit block 4 to a phase detector 5. The circuit block 4 simulates the signal propagation time that is effective in the block 3. The phase detector 5 compares the phase angles of the fed-back signal with the clock signal CLK fed to the delay unit 2 on the input side. A loop filter 6 is controlled in a manner dependent on this, the loop filter 6 generates the control signal CTRL on an output side. The control loop readjusts the delay time of the delay unit 2 to such an extent that the phase difference of the signals fed to the phase detector 5 on the input side as far as possible becomes zero. The delay locked loop has the overall effect that a switching element controlled by the output clock CLKOUT provides data clock-synchronously with the input clock CLKIN. The delay locked loop is employed for example in a microprocessor or in an SDRAM. In an SDRAM, the clock signal CLKIN is fed in on the input side. The output signal CLKOUT finally controls an output driver for data values to be read from the SDRAM, so that the latter are present, in a manner controlled by the clock signal CLKOUT, clock-synchronously with the clock signal CLKIN fed in on the input side.

Figure 1:
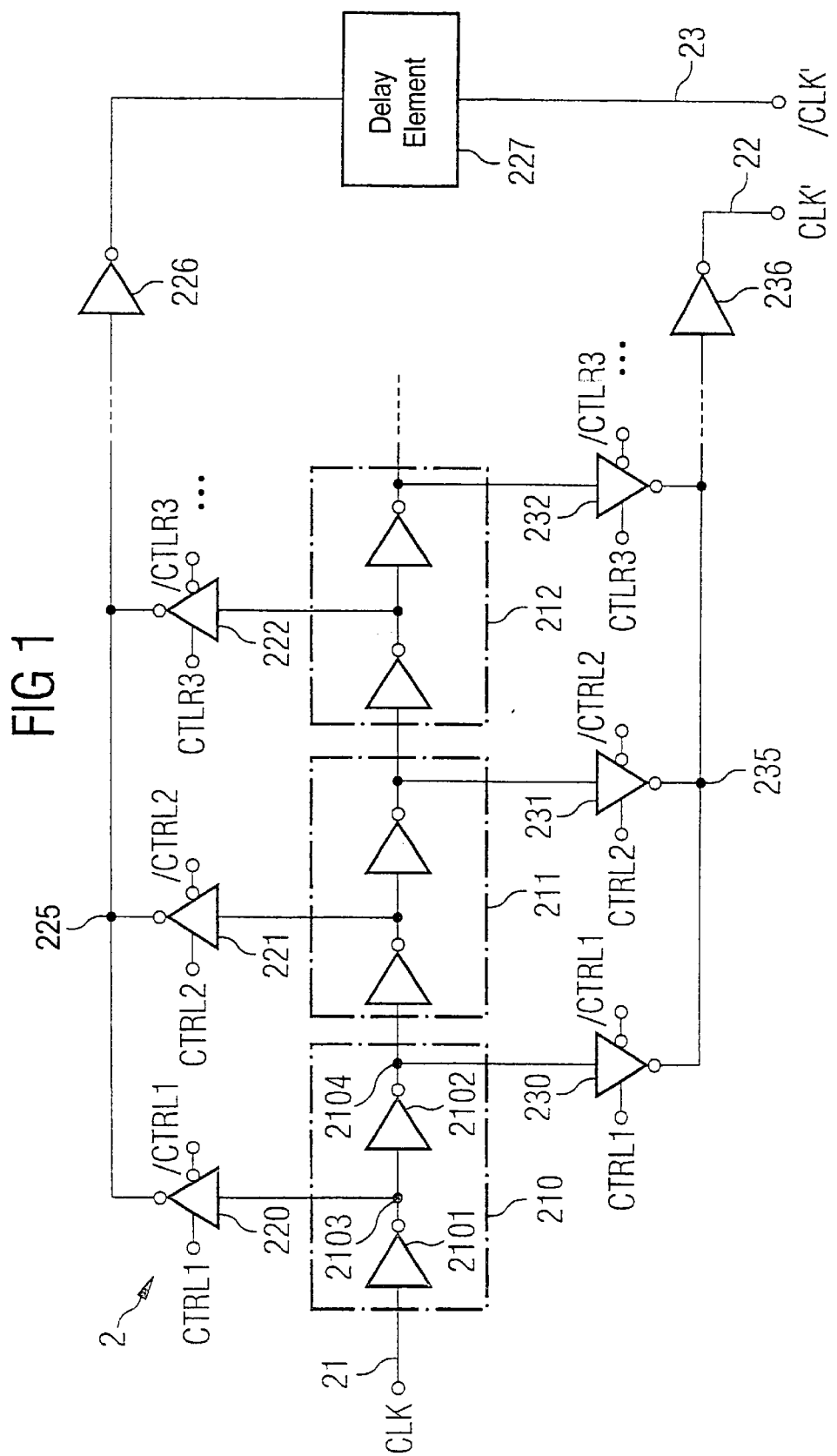
FIG. 1 is a circuit diagram of a delay unit according to the invention for application in a delay locked loop.

The delay unit 2 is illustrated in detail in FIG. 1. The single delay unit 2 has a multiplicity of series-connected delay elements 210, 211, 212. Each of the delay elements is constructed identically. Thus, by way of example, the delay element 210, just like the rest of the delay elements, has a first inverter 2101 and a second inverter 2102, whose input-output signal paths are connected in series with one another. At an input terminal 21, the first of the inverters 2101 of the delay unit 2 is fed by the clock signal CLK to be delayed by the delay unit 2. The clock signal CLK is switched through in the signal path along the inverters of the delay elements and runs as far as a non-illustrated end of the series circuit of delay elements. In dependence on the delay time determined by the control signal CTRL, switching elements 220, 221, 222, 230, 231, 232 are provided in order to tap off the delayed clock signal at the suitable location in the series circuit of delay elements.

The switching elements 220, 221, 222 are connected, on the input side, to the respective output of the first inverters of the delay elements, e.g. at the output of the inverter 2101. On the output side, the switching elements 220, 221, 222 are jointly coupled to a node 225. Each of the switching elements can be controlled by a bit of the control signal CTRL. Thus, by way of example, the switching element 220 is switched to the transmissive state or high-impedance state by the control signal CTRL1 and by the complement /CTRL1 thereof. The inverted delayed clock signal with respect to the clock signal CLK fed in on the input side is tapped off by the switching elements 220, 221, 222. The switching elements 230, 231, 232 are available for tapping off the non-inverted delayed clock signal, which switching elements are connected, on the input side, to the respective outputs of the second inverters of the delayed elements, e.g. to the output of the inverter 2102. On the output side, the switching elements 230, 231, 232 are jointly coupled to a node 235. The switching elements connected to the outputs of the inverters of an identical delay element are controlled in the same sense. Thus, the switching elements 220, 230, connected to the outputs of the inverters 2101 and 2102, are controlled by the same bits CTRL1 and /CTRL1 of the control signal CTRL. Mutually complementary delayed clock signals are tapped off via the switching elements 220, 230. The non-inverted clock signal with respect to the clock signal CLK fed in on the input side is tapped off via the switching element 230, and the inverted clock signal via the switching element 220. Depending on the desired delay time, one of the pairs of switching elements shown is activated. The other switching elements in each case are all switched to the high-impedance state.

All the inverters of the delay elements of the delay unit are dimensioned identically. Moreover, all the outputs of the inverters are connected up to identical capacitive loads, namely in each case to the input of an inverter that is connected downstream along the delay path and to the input of one of the switching elements. Thus, the output of the inverter 2101, which is also designated as node 2103, has the capacitive load due to the input of the downstream-connected inverter 2102 and the loading due to the input of the switching element 220. The output of the inverter 2102, which is also designated as node 2104, is loaded by the first inverter of the delay element 211 and also by the input of the switching element 230. Both nodes 2103 and 2104 are loaded identically. A signal edge is therefore delayed in each case by the same delay time through the inverters 2101 and 2102. Therefore, corresponding edges of the inverted and non-inverted delayed clock signals which are tapped off via the switching element 220 and the switching element 230, respectively, have the same phase delay with respect to one another as, for example, the delayed inverted and non-inverted clock signals tapped off at the delay element 212 via the switching elements 222, 232. The phase difference between the two tapped-off clock signals amounts to the delay time along the second inverter of the respective delay element, e.g. the inverter 2102 of the delay element 210. The tapped-off delayed signal components of the inverted and non-inverted delayed clock signals therefore have the same phase shift with respect to one another, independently of the frequency of the clock signal and independently of the length of the delay time.

Finally, a further delay element 227 is connected downstream of the node 225, which orients the edges of the two complementary delayed clock signals to one another. The further delay element 227 has a delay time equal to the delay time of a second inverter of one of the delay elements, e.g. of the inverter 2102. However, the delay element 227 effects no inversion of the signal. Consequently, the complementary delayed clock signals CLK' and /CLK' tapped off on the output side are synchronous with mutually corresponding complementary edges which are temporally close together. In addition, drivers, namely inverters 226, 236, are also connected downstream of the nodes 225, 235. The drivers 226, 236 are also dimensioned identically with respect to one another. The output signal CLK' of the delay path 2 is fed into the feedback path of the delay locked loop. The control is thus effected using the fed-back non-inverted signal CLK'. The inverted signal/CLK' with respect thereto is simultaneously provided edge-synchronously by virtue of the measures specified. The two complementary clock signals are generated in a functionally reliable manner independently of the length of the delay time even at high clock frequencies of the clock signal CLK to be delayed.

Figure 2:
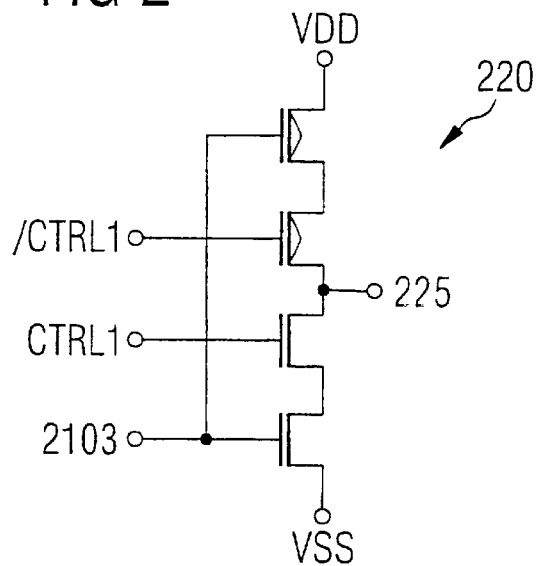
FIG. 2 is a circuit diagram of transistor having a tri-state gate.

One embodiment of a tri-state gate is shown in FIG. 2. All the tri-state gates 220, 221, 222, 230, 231, 232 are constructed accordingly. FIG. 2 shows the tri-state gate 220 in its circuit environment. It contains two p-channel MOS transistors that are connected in series by the drain-source paths and are connected to the positive supply voltage VDD. The p-channel MOS transistors are connected to the reference-ground potential VSS via two n-channel MOS transistors that are connected in series by their drain-source paths. The transistors that are directly connected to the supply potentials are driven by the input signal on the gate side, in this case from the node 2103. The output 225 of the tri-state gate 220 is connected to the coupling node of p-channel and n-channel transistors. The inner p-channel transistor forms the inverted input for the inverted control signal /CTRL1 and the inner n-channel transistor forms the non-inverted control input of the tri-state gate and is driven by the non-inverted control signal CTRL1.

We claim:

1. A delay locked loop for generating complementary clock signals, comprising:

a delay unit having a terminal for receiving a clock signal to be delayed, a first output terminal for a delayed clock signal, a second output terminal for a delayed complementary clock signal, and a control terminal for receiving a control signal controlling a delay time, said delay unit including:

a series circuit of delay elements, said delay elements each having a series circuit formed by a first inverter with an output and a second inverter with an output, said second inverter connected downstream of said first inverter;

first switching elements receiving and can be switched by the control signal, each of said first switching elements having an input connected to said output of said first inverter of one of said delay elements, said first switching elements having outputs connected to each other to form a first common node, said first common node coupled to one of said first and second output terminals; and second switching elements receiving and can be switched by the control signal, each of said second switching elements having an input connected to said output of said second inverter of one of said delay elements, said second switching elements having outputs connected to each other to form a second common node, said second common node coupled to another of said first and second output terminals; and a feedback loop feeding one of the delayed clock signal and the delayed complementary clock signal provided from said first output terminal and said second output terminal, respectfully, back to said control terminal.

2. The delay locked loop according to claim 1, wherein said second inverter has a predetermined delay time; and further comprising a further delay element connected between one of said first and second common nodes and one of said first and second output terminals, said further delay element having a delay time equal to the predetermined delay time.

3. The delay locked loop according to claim 2, wherein said further delay element is connected to said second output terminal supplying the delayed complementary clock signal which is complementary with respect to the delayed clock signal.

4. The delay locked loop according to claim 2, wherein said further delay element has an output terminal for outputting an input signal fed to said further delay element in a non-inverted form and delayed by the predetermined delay time.

5. The delay locked loop according to claim 1, further comprising third inverters, each of said third inverters connected between one of said first and second common nodes and one of said first and second output terminals.

6. The delay locked loop according to claim 1, wherein said first and second switching elements are in each case tristate gates each having an input side and which, in a manner dependent on the control signal are switched to a high-impedance state or to a transmitter state in response to the control signal applied on said input side.

* * * * *